(12) United States Patent
Kanjanavikat

(10) Patent No.: US 6,283,113 B1
(45) Date of Patent: Sep. 4, 2001

(54) STRIP SEPARATION TOOL

(75) Inventor: Adisorn Kanjanavikat, Bangkok (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/660,340

(22) Filed: Sep. 14, 2000

(51) Int. Cl.[7] .................................................. B28D 5/04
(52) U.S. Cl. .............................. 125/36; 451/339; 29/239
(58) Field of Search ............................. 451/28, 364, 339, 451/365, 404; 29/239

(56) References Cited

U.S. PATENT DOCUMENTS 5,966,790 * 10/1999 Meedt ..................................... 29/239

* cited by examiner

*Primary Examiner*—Derris H. Banks
(74) *Attorney, Agent, or Firm*—Paul J. Winters

(57) ABSTRACT

A tool is provided herein for separating stacked strips of semiconductor structures held by a magazine, which strips have become attached together. The tool is made up of first and second elongated members in side-by-side relation, each member defining a plurality of teeth along an edge thereof. The first and second members are mounted together so as to allow relative reciprocal movement therebetween, so that relative reciprocal movement between the pluralities of teeth is provided. The tool is held with the teeth against the edges of strips carried by the magazine, and the operator squeezes and releases member handles to provide relative reciprocal movement of the teeth. This back-and-forth reciprocal movement causes the teeth to rub against and force apart the strips, to in turn separate them.

10 Claims, 4 Drawing Sheets

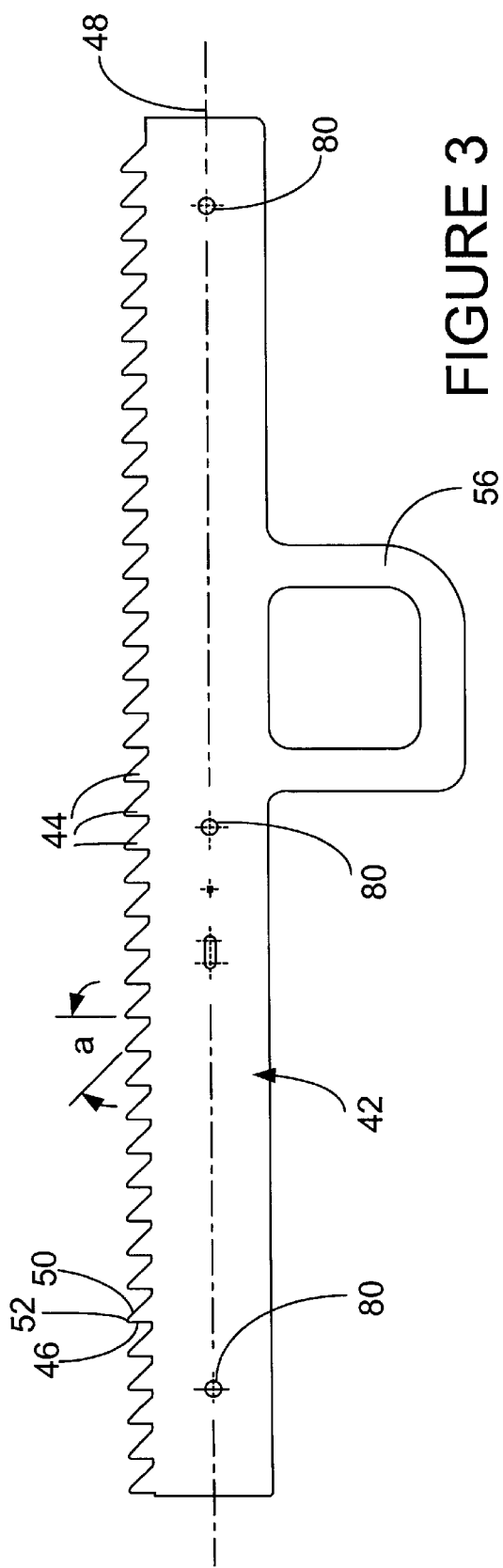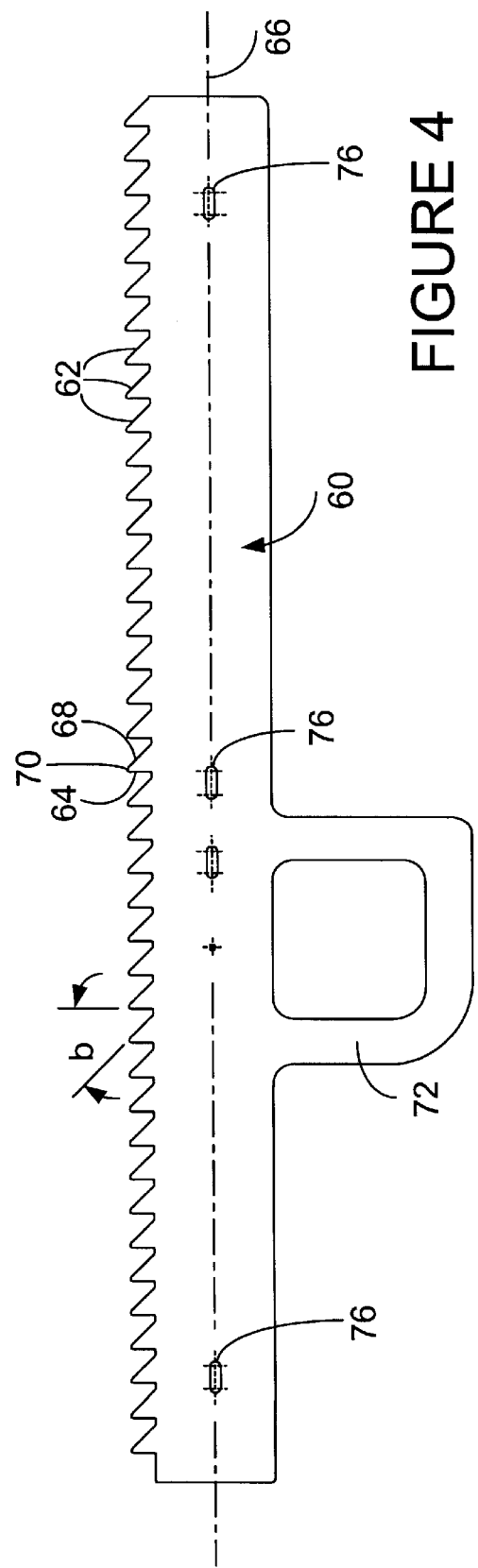

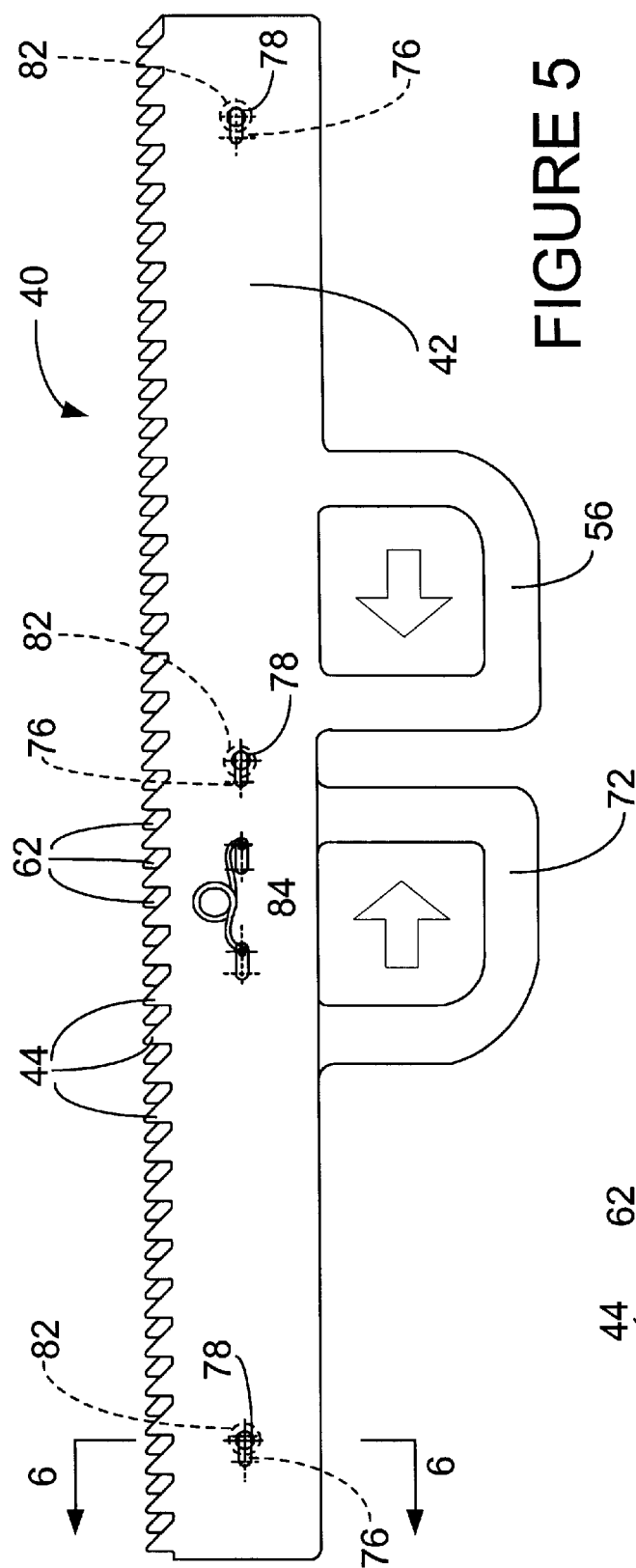
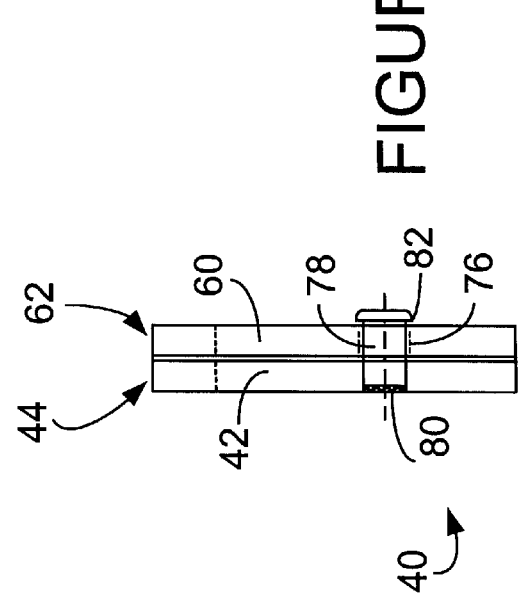

STRIP SEPARATION TOOL

BACKGROUND OF THE INVENTION

1. Field of the Invention

This invention relates generally to semiconductor fabrication, and more particularly, to a tool for use in the fabrication of semiconductor devices.

2. Discussion of the Related Art

End-of line (EOL) fabrication of semiconductor devices includes processing at mold, post mold cure, plating, and trim and form stations. A magazine holding a stack of strips including lead frames with die thereon is loaded onto the mold station. The strips are fed one at a time from the magazine into the mold station for processing, and are loaded one at a time from the station into another magazine after such processing. The loaded magazine is then moved to and placed in a cure oven at the post mold cure station. After curing, the magazine containing the strips is loaded onto the next (plating) station. The strips are fed one at a time from the magazine into the plating station for processing, and are loaded one at a time from the station into another magazine after such processing. This loaded magazine is transported to a trim and form station, where again the strips are fed one at a time from the magazine into the trim and form station for processing.

A typical magazine 20 for use in this environment is shown in FIG. 1. The magazine 20 includes a back portion 22, side portions 24, 26, front edges 28, 30 and a bottom support plate 32 on which a plurality of strips 34 is stacked. The magazine 20 as shown in FIG. 1 contains, for example, a stack of strips 34 (FIG. 2) each of which is made up of a lead frame 36 and a plurality of die (not shown) packaged in molding compound 38. As noted, the bottom portions of packages 38 of a strip 34 lie on and contact the top portions of the packages 38 of the strip 34 therebelow.

After, for example, post mold cure, which is undertaken at a very high temperature for an extended time, it will be readily understood that with the strips 34 stacked as shown in FIGS. 1 and 2, the packages 38, and thus the strips 34, may become attached to or stuck to each other. In this state, when the magazine 20 holding these strips 34 is installed at the next (plating) processing station, the mechanism for feeding strips 34 into that processing station may pick up two or more (stuck together) strips 34 at the same time, causing jamming of the processing station and undesirable process down time.

In attempting to deal with this problem, prior to installation of the magazine 20 at a processing station, an attempt can be made to separate the stuck-together strips 34 manually, i.e., using one's fingers. This is time-consuming and has proven to be ineffective, as some strips 34 may remain attached or stuck together. As an alternative, tweezers or other sharp objects have been used in an attempt to separate the strips 34, but it has been found that this method has great potential for causing strip damage.

Therefore, what is needed is a method/tool for separating strips that may have become attached together, to insure that a magazine loaded onto a processing station contains only separated or free strips which can be fed one at a time from the magazine into the processing station.

SUMMARY OF THE INVENTION

The present invention is a tool for separating stacked strips of semiconductor structures. The tool includes first and second elongated members in side-by-side relation. Each member defines a plurality of teeth along an edge thereof, the first and second members being positioned so that the teeth of the first elongated member are adjacent and lie along the teeth of the second elongated member. The first and second members are mounted together to allow relative reciprocal movement therebetween, so that relative reciprocal movement between the first and second pluralities of teeth is provided. The tool is held with the teeth thereof against strips carried by a magazine, and the operator squeezes and releases member handles to provide relative reciprocal movement of the teeth. This back-and-forth, reciprocal movement causes the teeth to rub against and force apart the edges of the strips, to in turn separate them.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

FIG. 3 is a side view of the first elongated member of the tool of the present invention;

FIG. 4 is a side view of the second elongated member of the tool of the present invention;

FIG. 5 is a side view of the tool of the present invention, including the first and second elongated members thereof;

FIG. 6 is a sectional view taken along the line 6—6 the FIG. 5;

DETAILED DESCRIPTION

Figure 1:
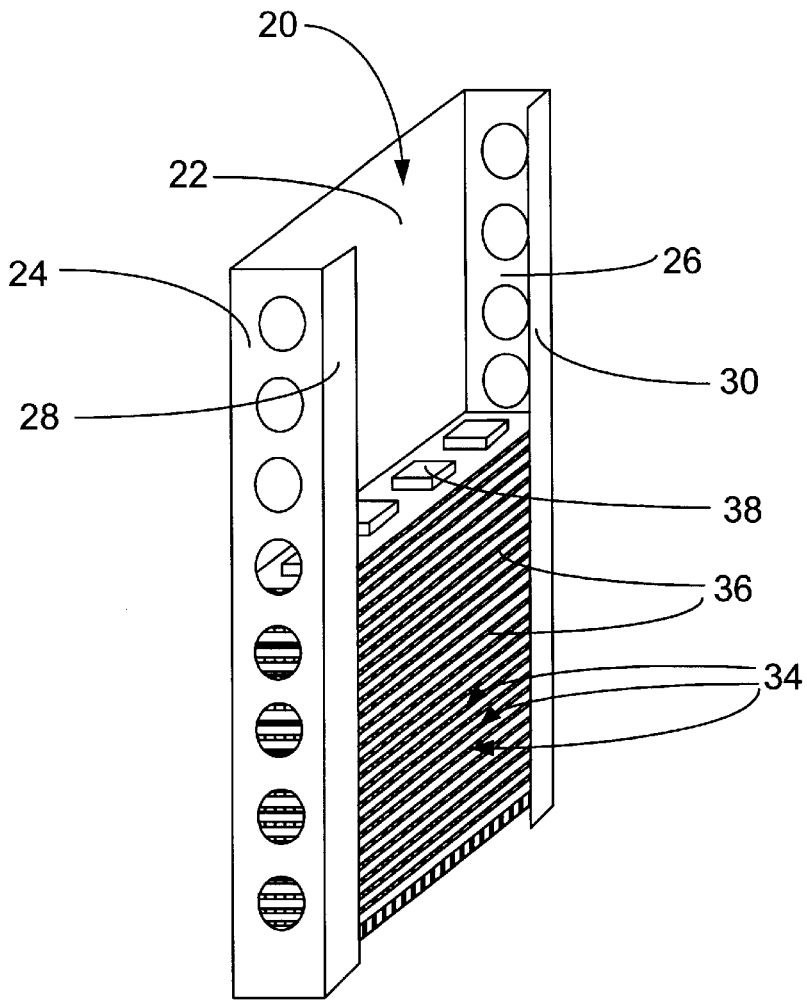
FIG. 1 is a perspective view of a magazine holding a plurality of strips, as is well-known in the prior art.
Figure 2:
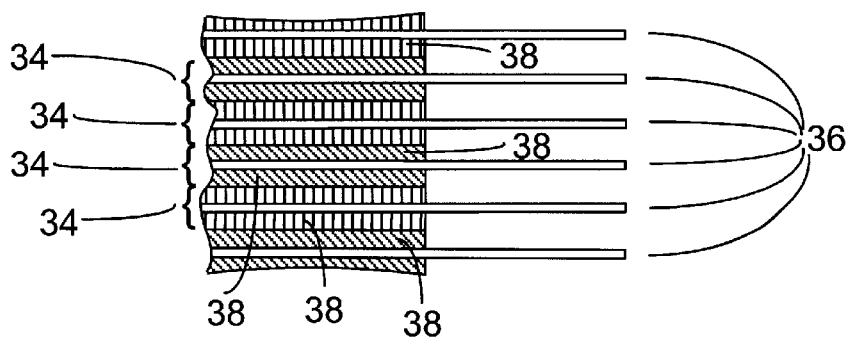
FIG. 2 is a sectional view of the stacked strips of FIG. 1.

Reference is now made in detail to specific embodiment of the present invention that illustrates the best mode presently contemplated by the inventor for practicing the invention.

FIGS. 3 and 4 show the main elements making up the tool 40 of FIG. 5. FIG. 3 shows a first elongated member 42 that is generally flat and rectangular in configuration, and defines along an elongated edge thereof a plurality of teeth 44. Each of the teeth 44 has a first side 46 that is substantially perpendicular to the longitudinal axis 48 of the member 42, and a second side 50 angled toward the first side 46, at an angle "a" of substantially 45° from the longitudinal axis 48 of the member 42, the first and second sides 46, 50 terminating in a rounded tooth point 52. The points 52 of the teeth 44 lie in a straight line. A handle 56 extends from an edge of member 42 opposite the row of teeth 44.

A second elongated member 60 is shown in FIG. 4. This elongated member 60 is also generally flat and rectangular in configuration, and defines along an elongated edge thereof a plurality of teeth 62, configured similar to the teeth 44 of the first elongated member 42. That is, each of the teeth 62 has a first side 64 that is substantially perpendicular to the longitudinal axis 66 of the member 60, and a second side 68 angled toward the first side 64 at an angle "b" of substantially 45° from the longitudinal axis 66 of the member 60, the first and second sides 64, 66 terminating in a rounded point 70. The elongated member 60 also includes a handle 72 extending from an edge thereof opposite the row of teeth 62, similar to that of the elongated member 42. The points of the teeth 70 also lie in a straight line.

The elongated members 42, 60 are positioned in side-by-side relation, member 42 lying on top of member 60 as shown in FIG. 5, with their longitudinal axes 48, 66 substantially parallel. The elongated member 60 includes slots 76 that lie parallel to the longitudinal axis 66 of the member 60, and pins 78 extend through these slots 76 in sliding relation therewith, and are secured by welding in apertures 80 in member 42 (FIG. 6). The pins 78 have heads 82 thereon so that the assembly is held together, but with sufficient clearance being provided between elements to allow a sliding fit between the member 42 and member 60, along the longitudinal axes 48, 66 of the members 42, 60, as allowed and limited by the slots 76 and pins 78. The first and second pluralities of teeth 44, 62 lie adjacent and along each other in side-by-side relationship, and extend in the same direction, with the angled sides 50, 68 of the respective pluralities of teeth 44, 62 being substantially parallel. A spring 84 interconnects the first and second members 42, 60 and resiliently biases the members 42, 60 into first relative positions (handles 56, 72 further apart, FIG. 5), limited and determined by the slots 76 and pins 78 as shown in FIG. 5. However, through application of pressure by the fingers of the user of the tool 40 on the handles 56, 72 in the directions indicated by the arrows (FIG. 5), the first and second members 42, 60 can be moved to second relative positions (handles 56, 72 closer together) against the resilience of spring 84, again limited and determined by the slots 76 and pins 78.

Figure 7:
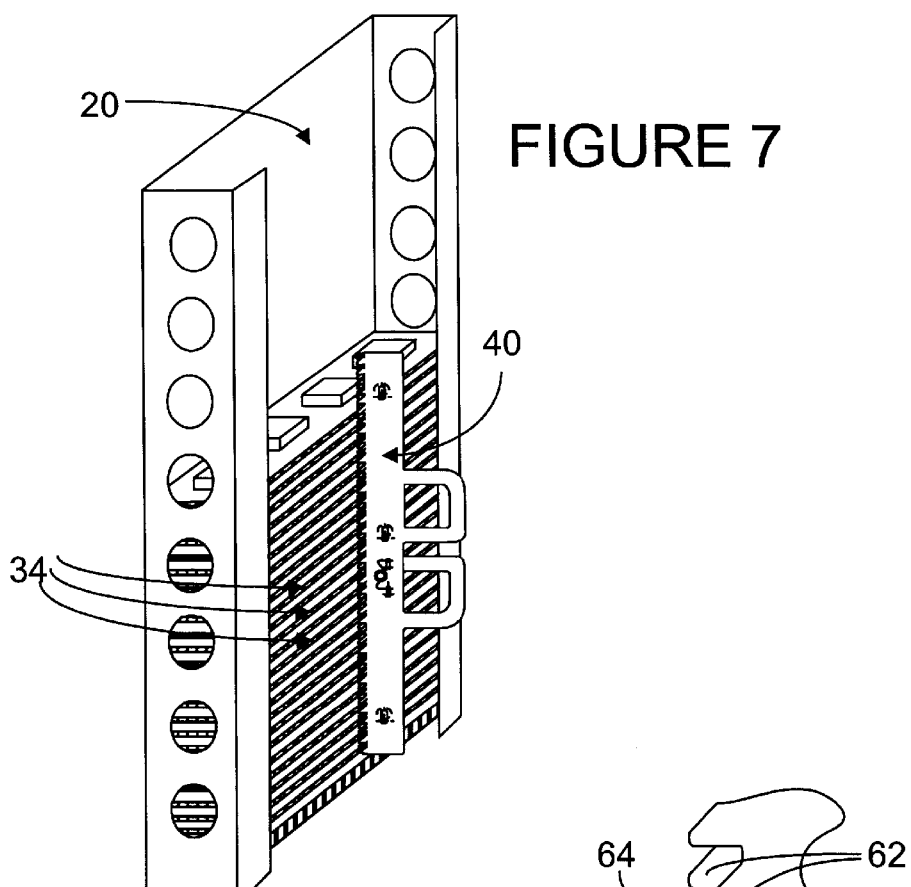
FIG. 7 is a perspective view similar to that shown in FIG. 1, and showing the use of the tool.
Figure 8:
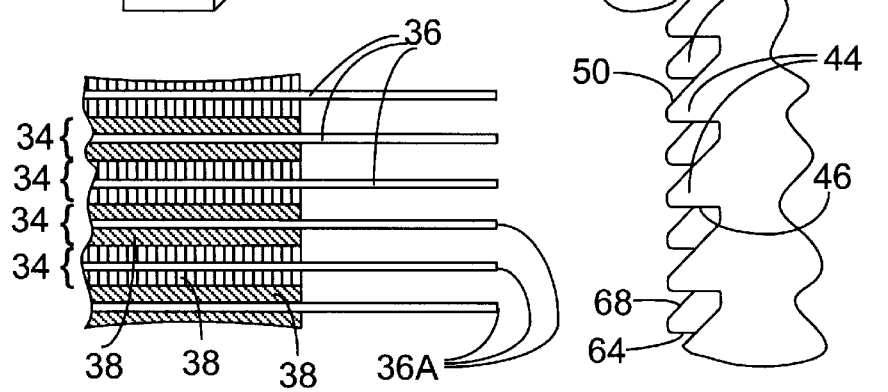
FIG. 8 is enlarged view of a portion of the device of FIG. 7, showing the tool in a first state.
Figure 9:
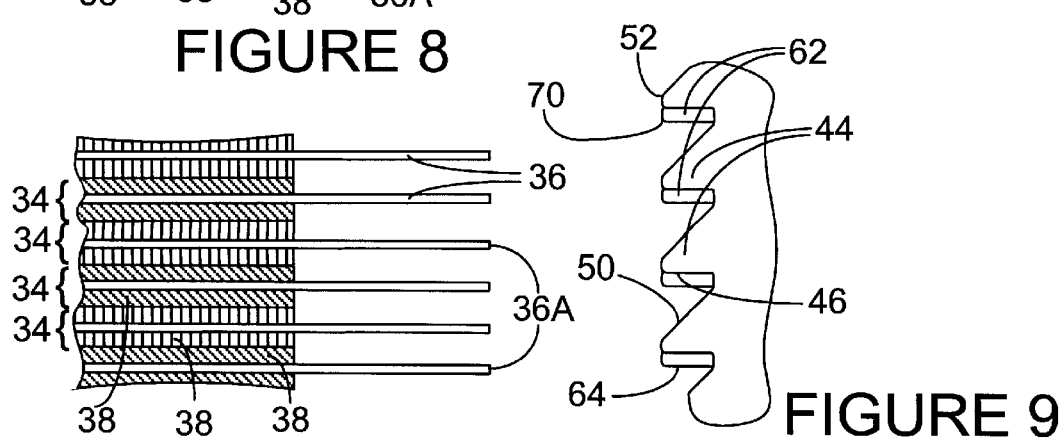
FIG. 9 is a view similar to that shown in FIG. 8, but with the tool in a second state.

FIG. 7 shows the tool 40 being used with a magazine 20 holding stacked strips 34 that, for example, have just the left the cure station, and a number of them may be stuck together as described above. As shown in FIG. 8, the teeth 44, 62 of the tool 40, positioned as shown in FIG. 8 and FIG. 5 under the force of spring 84 and limited in movement by the pins 78 and slots 76, are brought into engagement with the edges 36A of the lead frames 36 of the strips 34 (FIG. 8), and the handles 56, 72 of the members are moved together by application of finger pressure to move the teeth 44, 62 over the edges 36A and bring the teeth 44, 62 into the relative positions (limited by the pins 78 and slots 76) shown in FIG. 9. This initial movement of the members 42, 60 will cause some of the attached strips 34 to separate due to the friction applied by the moving teeth 44, 62 to the strips 34, and also due to the separation of teeth 44, 62 relative to each other as this movement occurs. With the members 42, 60 (and their teeth 44, 62) in their second relative positions (handles 56, 72 closer together), the points 52, 70 of adjacent teeth 44, 62 of the two sets of teeth are quite close together and overlap to a large extent (FIG. 9), allowing the points 52, 70 of the teeth 44, 62 to readily extend between edges 36A of adjacent pairs of strips 34, so that movement of the first and second members 42, 60 back to their original positions (handles 56, 72 further apart), under the resilience of the spring 84 and also through the force of the fingers of the user, applies separating force to each adjacent pair of strips 34. A back and forth relative movement of the members 42, 60, along with repositioning of the tool 40 itself relative to the strips 34 as chosen (up or down in FIG. 5), can be repeated several times in a period of a few seconds to insure that all strips 34 are properly separated. The magazine 20 then can be moved to the next station, and it is insured that each strip 34, in a free or unstuck state, can be mechanically removed one at a time without problem to avoid jarring at that station.

The particular configuration of the teeth 44, 62, and the relationship of one set of teeth to the other, is an important feature. It will be seen that with sides 46 of the teeth 44 perpendicular to the longitudinal axis 48 of the member 42, and with sides 50 of the teeth at an angle of 45° with respect to the longitudinal axis 48 of the member 42, and also with the sides 64 of the teeth 62 perpendicular to the longitudinal axis 66 of the member 60, and with the sides 68 of the teeth 62 at an angle of 45° with respect to the longitudinal axis 66 of the member 60, and further with the angled sides 50, 68 parallel to each other, an edge 36A of a strip lead frame 36 cannot be caught (and possibly damaged) between teeth, but as teeth come together, will be forced out from between adjacent teeth. Thus, the lead frames 36 cannot be damaged by the tool 40, yet the tool 40 still provides effective separating force of the stacked strips 34.

It will therefore be seen that a tool has been provided for separating attached, stacked strips in a magazine, so that the strips may be in readily fed into a processing station one-by-one as required to avoid jamming of the processing station. The tool is highly effective and rapid in separating attached strips, meanwhile avoiding damage to the strips.

The foregoing description of the embodiment of the invention has been presented for purposes of illustration and description. It is not intended to be exhaustive or to limit the invention to the precise form disclosed. Other modifications or variations are possible in light of the above teachings. The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A tool for separating structures comprising:

a first member defining a first plurality of teeth along an edge thereof;

a second member defining a second plurality of teeth along an edge thereof;

the first and second members being positioned so that the first plurality of teeth is adjacent the second plurality of teeth;

the first and second members being mounted together to allow relative reciprocal movement therebetween, so that relative reciprocal movement between the first plurality of teeth and second plurality of teeth can be provided;

wherein the first and second members are elongated members in side-by-side relation, with their longitudinal axes substantially parallel.

2. A tool for separating structures comprising:

a first member defining a first plurality of teeth along an edge thereof;

a second member defining a second plurality of teeth along an edge thereof;

the first and second members being positioned so that the first plurality of teeth is adjacent the second plurality of teeth;

the first and second members being mounted together to allow relative reciprocal movement therebetween, so that relative reciprocal movement between the first plurality of teeth and second plurality of teeth can be provided;

wherein the first plurality of teeth lies along an elongated edge of the first member, and the second plurality of teeth lies long an elongated edge of second member, the first plurality of teeth lying along the second plurality of teeth.

3. A tool for separating structures comprising:

a first member defining a first plurality of teeth along an edge thereof;

a second member defining a second plurality of teeth along an edge thereof;

the first and second members being positioned so that the first plurality of teeth is adjacent the second plurality of teeth;

the first and second members being mounted together to allow relative reciprocal movement therebetween, so that relative reciprocal movement between the first plurality of teeth and second plurality of teeth can be provided;

and further comprising means for limiting relative movement of the first and second members to first and second limiting states, and further comprising spring means for biasing the first and second members toward the first limiting state, the first and second members being relatively movable against the spring means to the second limiting state.

4. A tool for separating structures comprising:

a first member defining a first plurality of teeth along an edge thereof;

a second member defining a second plurality of teeth along an edge thereof;

the first and second members being positioned so that the first plurality of teeth is adjacent the second plurality of teeth;

the first and second members being mounted together to allow relative reciprocal movement therebetween, so that relative reciprocal movement between the first plurality of teeth and second plurality of teeth can be provided;

wherein the first member further comprises a first handle, and the second member further comprises a second handle, the first and second handles being positioned and configured so as to be manipulable by a hand of a user of the tool.

5. A tool for separating structures comprising:

a first member defining a first plurality of teeth along an edge thereof;

a second member defining a second plurality of teeth along an edge thereof;

the first and second members being positioned so that the first plurality of teeth is adjacent the second plurality of teeth;

the first and second members being mounted together to allow relative reciprocal movement therebetween, so that relative reciprocal movement between the first plurality of teeth and second plurality of teeth can be provided;

wherein the first and second members are elongated members, and wherein each of the first plurality of teeth has first and second sides, wherein the first side of each of the first plurality of teeth is non-perpendicular to the longitudinal axis of the first member, and is angled toward the second side of that tooth, and wherein each of the second plurality of teeth has first and second sides, wherein the first side of each of the second plurality of teeth is non-perpendicular to the longitudinal axis of the second member, and is angled toward the second side of that tooth.

6. The tool of claim 5 wherein the second side of each tooth of the first plurality of teeth is substantially perpendicular to the longitudinal axis of the first member, and wherein the second side of each tooth of the second plurality of teeth is substantially perpendicular to the longitudinal axis of the second member.

7. The tool of claim 5 wherein the first side of each tooth of the first plurality of teeth is at an angle of substantially 45° from the longitudinal axis of the first member, the, and wherein the side of each of the second plurality of teeth is at an angle of substantially 45° from the longitudinal axis of the second member.

8. The tool of claim 5 wherein the first and second sides of each tooth terminate to define a point of that tooth.

9. The tool of claim 8 wherein each of the points of the teeth of the first plurality of teeth lies in substantially a straight line, and wherein each of the teeth of the second plurality of teeth lies in substantially a straight line.

10. The tool of claim 9 wherein the points of the first and second pluralities of teeth lie in substantially the same plane.

* * * * *